(12) United States Patent
Giraudin et al.

(10) Patent No.: US 7,563,687 B2
(45) Date of Patent: Jul. 21, 2009

(54) METHOD OF FABRICATING A CAPACITOR BY USING A METALLIC DEPOSIT IN AN INTERCONNECTION DIELECTRIC LAYER OF AN INTEGRATED CIRCUIT

(75) Inventors: Jean-Christophe Giraudin, Bernin (FR); Sébastien Cremer, Sassenage (FR); Philippe Delpech, Meylan (FR)

(73) Assignee: STMicroelectronics S.A., Montrouge (FR)

( * ) Notice: Subject to any disclaimer, the term of this patent is extended or adjusted under 35 U.S.C. 154(b) by 488 days.

(21) Appl. No.: 11/302,971

(22) Filed: Dec. 14, 2005

(65) Prior Publication Data

US 2006/0160319 A1 Jul. 20, 2006

(30) Foreign Application Priority Data

Dec. 16, 2004 (FR) .................................. 04 13415

(51) Int. Cl.
*H01L 21/20* (2006.01)
(52) U.S. Cl. ............... 438/396; 438/393; 257/E21.011; 257/E21.577
(58) Field of Classification Search ................ 438/396, 438/393, 624, 253; 257/E21.011, E21.008, 257/E21.004, E21.577, E21.579, E21.019
See application file for complete search history.

(56) References Cited

U.S. PATENT DOCUMENTS

| | | | |
|---|---|---|---|
| 5,604,696 A | 2/1997 | Takaishi et al. | |
| 5,851,870 A | 12/1998 | Alugbin et al. | |
| 6,008,083 A | 12/1999 | Brabazon et al. | |
| 6,180,976 B1 | 1/2001 | Roy | |
| 6,249,014 B1 | 6/2001 | Bailey | |
| 6,251,740 B1 | 6/2001 | Johnson et al. | |
| 6,344,964 B1 | 2/2002 | Adler | |
| 6,399,399 B2 | 6/2002 | Yamamoto et al. | |
| 6,441,419 B1 | 8/2002 | Johnson et al. | |
| 6,452,779 B1 | 9/2002 | Adler et al. | |
| 6,611,014 B1 | 8/2003 | Kanaya et al. | |
| 6,713,840 B1 | 3/2004 | Lee et al. | |
| 6,765,255 B2 | 7/2004 | Jin et al. | |
| 6,876,027 B2 * | 4/2005 | Lien et al. | 257/306 |
| 7,253,075 B2 * | 8/2007 | Hieda | 438/393 |
| 2002/0094656 A1 | 7/2002 | Armacost et al. | |

(Continued)

OTHER PUBLICATIONS

Preliminary French Report, FR 04 13415, dated Aug. 11, 2005.

*Primary Examiner*—Walter L Lindsay, Jr.
(74) *Attorney, Agent, or Firm*—Gardere Wynne Sewell LLP

(57) ABSTRACT

A manufacturing process for a capacitor in an interconnection layer includes the following stages: Deposit of a first metallic layer (21); Deposit of a first insulator layer (31) on the first metallic layer (21); Deposit of a second metallic layer (41) on the first insulator layer (31); Formation of an upper electrode (4) in the second layer metallic (41); Deposit of a second insulator layer (13) covering the upper electrode (4); Etching of the second insulator layer to form a spacer (14) on this first insulator layer surrounding the upper electrode (4); then Formation of a lower electrode (2) and a dielectric (3) by removal of parts from the first metallic layer and insulator not covered by the upper electrode (4) or the spacer (14); and Formation of an interconnection line (5). This process allows for manufacturing capacitors with an increased performance, in a simplified fashion at lower cost and with an auto-alignment.

14 Claims, 2 Drawing Sheets

U.S. PATENT DOCUMENTS

| | | |
|---|---|---|
| 2002/0163029 A1 | 11/2002 | Dirnecker et al. |
| 2003/0222301 A1 | 12/2003 | Igarashi |
| 2004/0053427 A1 | 3/2004 | Lee |
| 2004/0169211 A1 | 9/2004 | Zhuang et al. |
| 2004/0201057 A1 | 10/2004 | Lien et al. |
| 2005/0064718 A1 | 3/2005 | Yin et al. |
| 2005/0116276 A1* | 6/2005 | Gau ........................... 257/306 |
| 2007/0026626 A1* | 2/2007 | Ditizio et al. ............... 438/396 |

\* cited by examiner

METHOD OF FABRICATING A CAPACITOR BY USING A METALLIC DEPOSIT IN AN INTERCONNECTION DIELECTRIC LAYER OF AN INTEGRATED CIRCUIT

PRIORITY CLAIM

The present application claims priority from French Patent Application No. 04 13415 filed Dec. 16, 2004, the disclosure of which is hereby incorporated by reference.

BACKGROUND OF THE INVENTION

1. Technical Field of the Invention

The invention concerns circuits presenting interconnection layers and specifically the manufacture of capacitors in such layers.

2. Description of Related Art

Some integrated circuits present a silicon substrate on which a multitude of transistors are formed. These circuits present several interconnection layers superimposed on the substrate in which the passive components are arranged such as capacitors. Such capacitor formation typically includes a metallic deposit and it's shaping by the classic stages of masking and chemical etching.

FIGS. 1 and 2 schematically illustrate known circuit cross-sections including a MIM type capacitor (Metal-Insulator-Metal). Passivation layers have not been represented for reasons of legibility. These capacitors are realized by means of metallic deposits in an interconnection layer of the circuit. These capacitors are specifically used as a decoupling capacitance of an integrated circuit, as a coupling capacitance for impedance matching or as a radio frequency capacitance device. The silicon surface used by such capacitors is relatively important and therefore implies a significant cost.

FIG. 1 illustrates a planar capacitor. The circuit presents an insulator layer 1 integral with the substrate. One lower electrode 2 is arranged on the insulator layer 1. The lower electrode 2 is covered by an insulator layer 3, this layer 3 is itself covered by an upper electrode 4. The planar capacitor is realized at the same level as an interconnection line 5 on the insulator layer 1. The insulator layer 3 and electrodes 2 and 4 are flat.

FIG. 2 illustrates a three-dimensional capacitor. Electrodes 2 and 4 and the insulator layer 3 show relief, in order to increase surface density capacitance of the capacitor. The electrodes and layer 3 are thus formed in grooves of layer 1.

According to one manufacturing process of these two types of capacitor, electrodes 2 and 4 and insulator layer 3 are executed by stacking beforehand three layers by successive full plate deposition on insulator layer 1. The edge of the capacitor is then delimited by means of a mask and an etching of the three stacked layers. Since a similar stage of masking and etching is used to delimit the three layers, the capacitor edge is essentially perpendicular to layer 1.

Such a process presents drawbacks. Some capacitors formed in this way can present defects. A premature stressing or a leakage current can thus be generated between the upper electrode and the lower electrode. Etching residues such as the conductor polymers specifically can accumulate at the capacitor's edge. Defects induced by the etching can also lead to short-circuit. The miniaturization of capacitors leads to a reduced thickness of the insulator 3 layer. The risk of stress or current leakage is then further increased.

According to another manufacturing process, electrodes 2 and 4 as well as the insulator layer 3 are realized by previously stacking three successive layers of full plate deposits on insulator layer 1. A first edge is delimited by a first mask and by a first etching of layer 4. A second edge is delimited by a second mask and by a second etching of layers 3 and 2. FIG. 3 illustrates the edge of the capacitor obtained this way. The first edge thus delimits the upper electrode 4. The second edge delimits the lower electrode 2 and the insulator layer 3. The upper electrode 4 is therefore recessed with respect to the lower electrode 2. In addition, the electrodes are then separated by the surface of the insulator layer 3 between the two edges. The accidental short-circuit risk is thus considerably reduced.

In certain configurations a part of the lower electrode is used as interconnection metal. Three-dimensional capacitors currently use electrodes of reduced thickness in order to increase the surface density of the grooves. When the electrode thickness is very reduced, the lower electrode does not form a sufficiently thick interconnection metal and an additional interconnection line 5 is necessary. Interconnection lines are also used for the connection of the upper or lower layer components.

FIG. 4 illustrates a metallic deposit 6 formed on the capacitor. By masking and etching we seek to obtain the structure of FIG. 3. FIGS. 5 and 6 illustrate known defects of the capacitor obtained by such a process. In FIG. 5 the etching of the interconnection line 5 is insufficient and allows a parasitic metal deposit 7 to subsist between the edges of electrodes 2 and 4. This deposit 7 can generate a parasitic capacitance or a short-circuit between electrodes. On FIG. 6 the etching of the interconnection 5 line is excessive and suppresses the insulator layer 3 between the edges of electrodes 2 and 4. A short-circuit can then be formed between electrodes on the capacitor's edge, for example by a parasitic spacer formed by the conductor polymers. The number of photolithography stages is also increased, which raises the cost of the manufacturing process.

SUMMARY OF THE INVENTION

The invention relates to a manufacturing process of a MIM capacitor in an interconnection layer of an integrated circuit, comprising the following stages:

deposit of a first metallic layer on a lower dielectric interconnection layer or on a substrate;

deposit of a first insulator layer on the first metallic layer;

deposit of a second metallic layer on the first insulator layer;

formation of an upper electrode by removing a part of the second metallic layer;

deposit of a second insulator layer covering the upper electrode;

etching the second insulator layer to uncover the upper surface of the first insulator layer so as to form on this first insulator layer a spacer surrounding the upper electrode; then formation of a lower electrode and a dielectric by removing parts of the first metallic layer and the first insulator layer not covered by the upper electrode or the spacer;

deposit of a third metallic layer and formation of an interconnection line by removing part of this third metallic layer.

The etching of the second insulator layer is performed so that the width of the spacer is essentially constant over the periphery of the upper electrode.

According to a variant the process includes a deposition stage of a third insulator layer on the second metallic layer, the formation of the upper electrode includes the removal of part of the third insulator layer to form a protection covering that part of the second metallic layer not removed.

According to another variant, the process includes the deposition of a passivation layer on the capacitor and the interconnection line.

According to yet another variant the process includes the connection of the capacitor electrodes to another component of the integrated circuit.

According to yet another variant, the formation of the upper electrode includes the formation of a mask by photolithography and the etching of the unmasked zones of the second metallic layer.

The invention also relates to an integrated circuit, comprising an interconnection layer including:
  one capacitor presenting:
    one lower electrode realized on a lower interconnection dielectric layer or on a substrate;
    one dielectric covering the lower electrode;
    one upper electrode realized on the dielectric;
    an insulating spacer realized on the dielectric and surrounding the upper electrode;
  one interconnection line.

According to one variant, the outside edge of the insulating spacer is vertical to the dielectric and the lower electrode. The width of the insulating spacer is essentially constant over the periphery of the upper electrode.

According to one variant the upper electrode includes a metallic layer portion and a protection covering the metallic layer portion.

BRIEF DESCRIPTION OF THE DRAWINGS

A more complete understanding of the method and apparatus of the present invention may be acquired by reference to the following Detailed Description when taken in conjunction with the accompanying Drawings wherein.

DETAILED DESCRIPTION OF THE DRAWINGS

The invention proposes a manufacturing process of a capacitor in an interconnection layer of an integrated circuit. A first metallic layer is deposited on a substrate or on a lower interconnection dielectric layer, a first insulator layer is deposited on the first metallic layer and a second metallic layer is deposited on the first insulator layer. The second metallic layer is shaped so as to form an upper electrode. A second insulator layer is deposited to cover the upper electrode, then this layer is etched to form a spacer surrounding the upper electrode and to uncover the surface of the first insulator layer not covered by the upper electrode or the spacer. A third metallic layer is deposited then shaped to form an interconnection line.

The edge of the upper electrode is thus protected by the spacer during the subsequent stages. This edge is thus neither covered by a parasitic conductor deposit, nor damaged by subsequent etching. In addition, one photolithography mask is dispensed with in regard to the process according to the state of the art, the spacer is used for the formation of the lower electrode and the dielectric. Further, the removal width of the upper electrode with regard to the lower electrode is essentially constant over the entire periphery because it is defined by the spacer. The use of the spacer thus permits performing an auto-alignment between the upper electrode and the lower electrode. This alignment globally removes dispersions due to alignment between two successive masks. The average dimension of the cut-back can thus be reduced, the margin adopted in the state of the art to consider alignment errors between the successive masks may be eliminated. The area occupied by the capacitor is then reduced. This spacer can be considered as a hard mask by the expert in the field.

Figure 1:
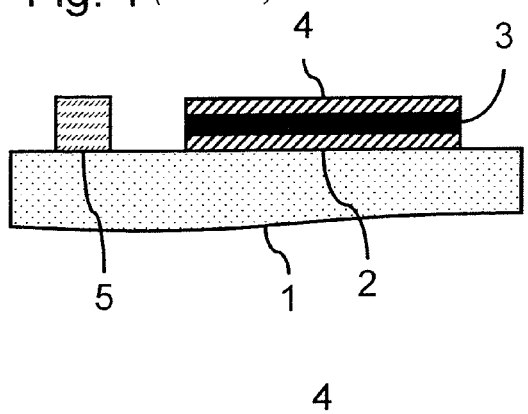
FIGS. 1 and 2 represent the schematic MIM capacitor sections according to the prior art.
Figure 2:
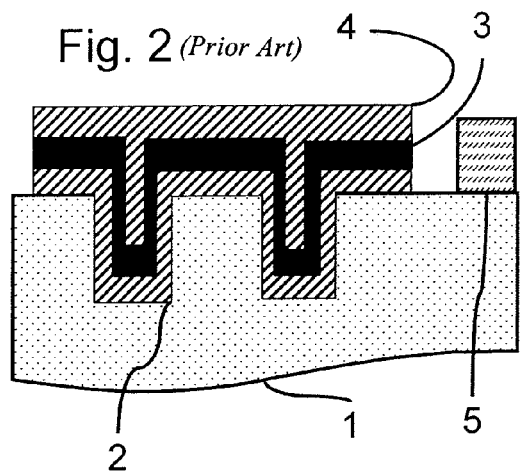
Figure 3:
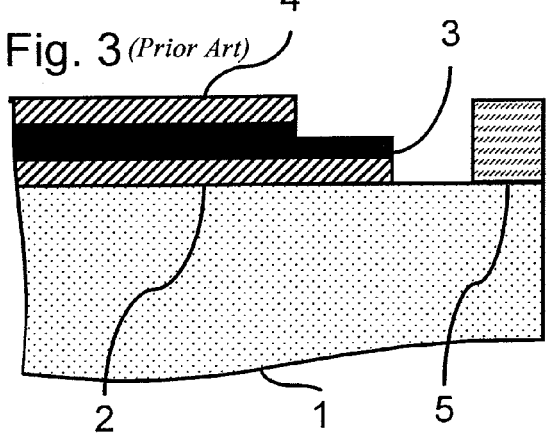
FIGS. 3 to 6 represent the capacitor of FIG. 2 in different phases of its manufacture.
Figure 4:
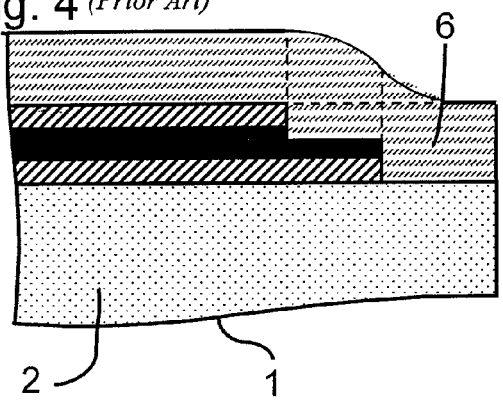
Figure 5:
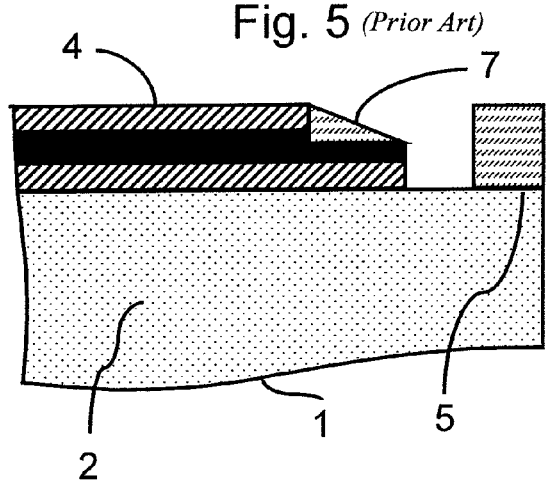
Figure 6:
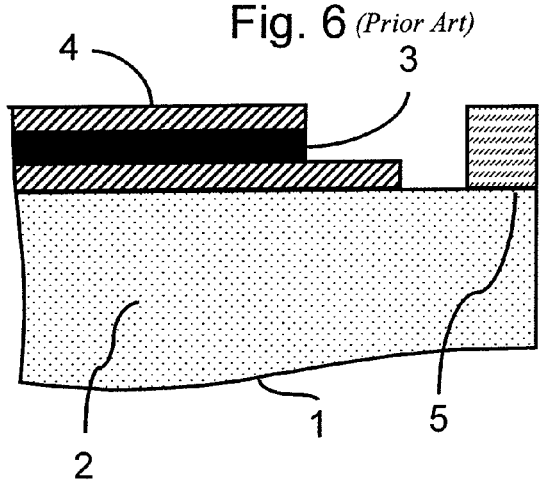
Figure 7:
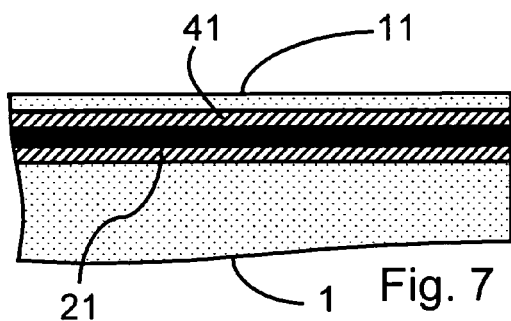
FIGS. 7 to 13 represent a capacitor during different phases of its manufacture according to the invention.

FIGS. 7 to 13 illustrate the application of the invention to the manufacture of a MIM capacitor. FIGS. 7 to 13 are views in generalized cross-section of the capacitor's edge during its manufacture. In FIG. 7, a metallic layer 21 has been deposited full plate on an inter-metallic dielectric (IMD) on the dielectric of a lower interconnection layer. This deposit can also be done directly on a substrate. An insulator layer 31 has been deposited full plate on the metallic layer 21. A metallic layer 41 has been deposited full plate on the insulator layer 31. Advantageously, an insulator layer 11 has been deposited full plate on the metallic layer 41, so as to protect the lower layer parts during the continuation of the process.

The material of the metallic layer 21 is for example TiN, TaN, W and the like. The material of the insulator 31 layer is for example $Al_2O_3$, $Ta_2O_5$, $HfO_2$ and the like, deposited by ALD (atomic layer deposition), by CVD or by MOCVD (metallorganic chemical vapor deposition). The material of the metallic layer 41 is for example TiN, TaN or W deposited by ALD or by chemical vapor deposition (CVD), by MOCVD or PVD (physical vapor deposition).

Figure 8:
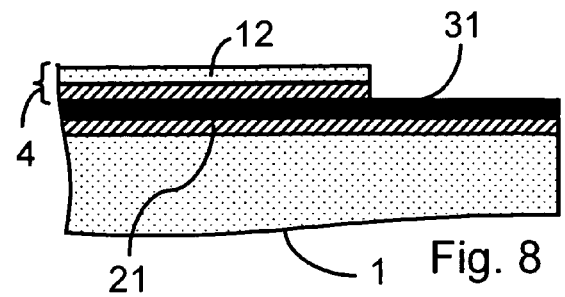

In FIG. 8, the upper electrode 4 of the capacitor has been formed by etching the metallic layer 41 and the protective layer 11. The protection formed 12 is of course only an optional element of the upper electrode 4. This etching is done for example by previous formation of a mask by photolithography on the protection layer 11. It may involve a resin masking realized by photolithography. The etching is done at least until the surface of the insulator layer 31 is uncovered.

Figure 9:
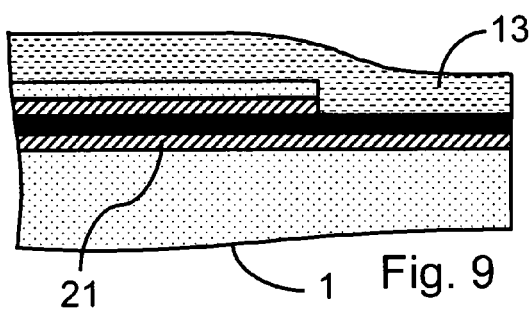

On FIG. 9 an insulator layer 13 has been deposited on the upper electrode 4 and on the insulator layer 31. This deposit for example is realized full plate using a material such as $SiO_2$ or $Si_3N_4$, deposited by chemical vapor deposition assisted by plasma. This layer 13 does not present a uniform thickness. Since the edge of the electrode 4 is obtained by etching, it presents an abrupt profile. Over a certain range, layer 13 presents a greater thickness in the zone adjacent to the electrode edge.

Figure 10:
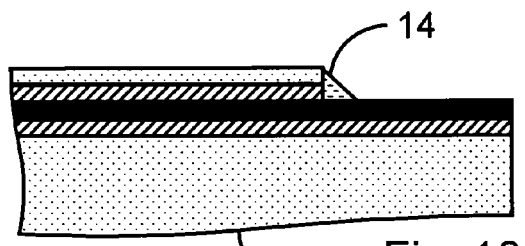

On FIG. 10, layer 13 has been removed globally by an anisotropic etching. This etching is done so as to uncover the upper surface of electrode 4 and the upper surface of insulator layer 31. At this stage a similar thickness of layer 13 has thus been removed. As the thickness of the layer 13 formed is greater over a certain range, residues of insulating material are retained in this zone. The etching is realized therefore so as to preserve a spacer 14 in insulating material surrounding at least the metallic part of the upper electrode 4.

Figure 11:
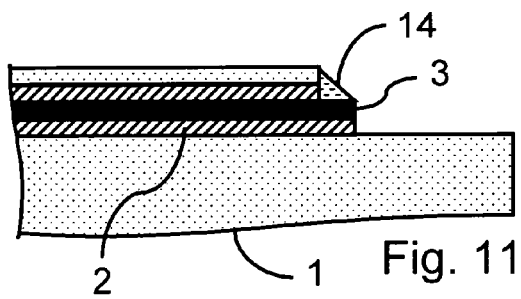

On FIG. 11, the lower electrode 2 and the dielectric 3 of the capacitor have been formed. This formation is done by removing those parts of layer 21 and 31 not covered by the electrode 4 or the spacer 14. The spacer 14 and the electrode 4 (possibly including the protective layer 11) are used for example as a mask for etching layers 21 and 31. Advantageously we avoid therefore forming a supplementary mask by photolithography when delimiting electrode 2 and dielectric 3.

Figure 12:
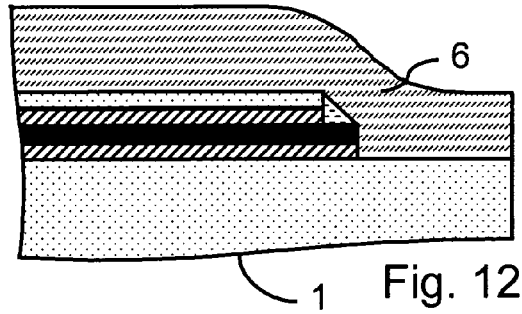

On FIG. 12, a metallic layer 6 has been deposited. This deposit can be done full plate by any appropriate means.

Figure 13:
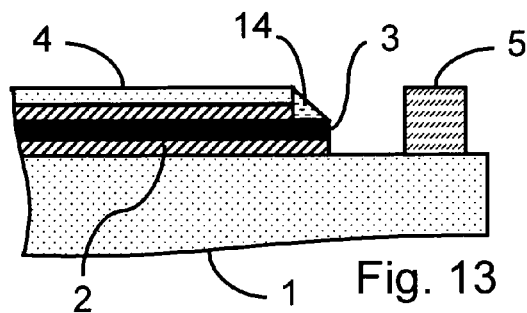

On FIG. 13 one or several interconnection lines 5 have been formed, for example by etching layer 6. Short-circuits between the edges of electrodes 2 and 4 are avoided because of the presence of the spacer 14. Further, the spacer also protects the dielectric 3 and the electrode 2 against excessive etching. Interconnection lines 5 are thus easily created at the same level as the capacitor. The manufacturing costs and risks of short-circuits, premature stresses or leakage currents are thus even further reduced.

Figure 14:
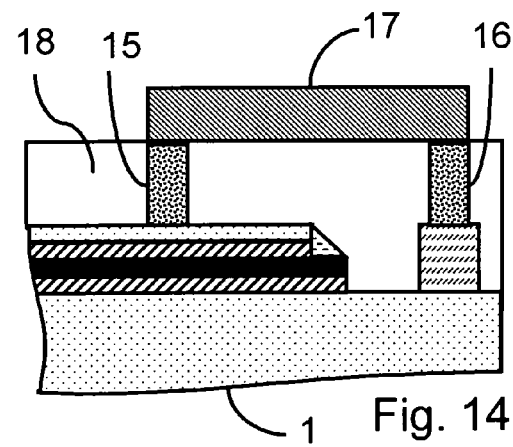
FIG. 14 illustrates the connection of the capacitor with other components.

At the time of subsequent stages, not represented here, electrodes are connected through vias 15 and 16 and connector 17 to other components and a passivation layer 18 is deposited on the capacitor formed. Connections with other components are realized for example in the upper or lower layers of interconnection. See, FIG. 14.

Such a manufacturing process applies both to the formation of a planar capacitor and to the formation of a three-dimensional capacitor.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

The invention claimed is:

1. Process for manufacture of a MIM capacitor in an interconnection layer of an integrated circuit, comprising:
   Deposition of a first metallic layer on one of a lower interconnection dielectric layer or a substrate;
   Deposition of a first insulator layer on the first metallic layer;
   Deposition of a second metallic layer on the first insulator layer;
   Formation of an upper electrode of the MIM capacitor by removing part of the second metallic layer and expose a top surface of the first insulator layer;
   Deposition of a second insulator layer covering the upper electrode and top surface of the first insulator layer;
   Etching of the second insulator layer to uncover the upper surface of the first insulator layer except at a corner location adjacent the upper electrode where second insulator layer material remains to form a spacer surrounding the upper electrode;
   Formation of a lower electrode and a dielectric of the MIM capacitor by removing part of the first metallic layer and that part of the first insulator layer not covered by the upper electrode or the spacer;
   Deposition of a third metallic layer and formation of an interconnection line by removing part of this third metallic layer; and
   Deposition of a passivation layer which covers the MIM capacitor, spacer and the interconnection line.

2. Process of manufacture according to claim 1, wherein the etching of the second insulator layer is realized so that the width of the spacer is essentially constant over the periphery of the upper electrode.

3. Process for manufacture of a MIM capacitor in an interconnection layer of an integrated circuit, comprising
   deposition of a first metallic layer on one of a lower interconnection dielectric layer or a substrate;
   deposition of a first insulator layer on the first metallic layer;
   deposition of a second metallic layer on the first insulator layer;
   formation of an upper electrode by removing part of the second metallic layer;
   deposition of a second insulator layer covering the upper electrode;
   etching of the second insulator layer to uncover the upper surface of the first insulator layer so as to form on this first insulator layer a spacer surrounding the upper electrode; then
   formation of a lower electrode and a dielectric by removing part of the first metallic layer and that part of the first insulator layer not covered by the upper electrode or the spacer;
   deposition of a third metallic layer and formation of an interconnection line by removing part of this third metallic layer; and
   deposition of a third insulator layer on the second metallic layer, wherein the formation of the upper electrode comprises removal of a part of the third insulator layer to form a protection covering that part of the second metallic layer not removed.

4. Process of manufacture according to claim 1, further comprising deposition of a passivation layer on the capacitor and the interconnection line.

5. Process of manufacture according to claim 1, further comprising connection of the capacitor electrodes to another component of the integrated circuit.

6. Process of manufacture according to claim 1, in which the formation of the upper electrode includes the formation of a mask by photolithography and the etching of the unmasked zones of the second metallic layer.

7. A process for manufacturing a capacitor, comprising:
   forming an underlying support layer of an integrated circuit;
   forming a metal-insulator-metal structure on top of the underlying support layer;
   defining the metal-insulator-metal structure to form a capacitor wherein there is an offset region between a peripheral edge of a top metal layer and a bottom metal layer of the metal-insulator-metal structure;
   forming an insulating spacer on the offset region; and
   depositing an insulating layer over the metal-insulator metal structure and insulating spacer.

8. The process of claim 7 wherein the underlying support layer is a lower interconnection dielectric layer of the integrated circuit.

9. The process of claim 7 wherein the underlying support layer is a substrate of the integrated circuit.

10. The process of claim 7 wherein the insulating spacer in the offset region protects against a short circuit forming between the top metal layer and bottom metal layer of the metal-insulator-metal structure.

11. A process for manufacturing a capacitor, comprising:
   forming an underlying support layer of an integrated circuit;
   forming a metal-insulator-metal structure on top of the underlying support layer;
   defining the metal-insulator-metal structure to form a capacitor wherein there is an offset region between a peripheral edge of a top metal layer and a bottom metal layer of the metal-insulator-metal structure; and
   forming an insulating spacer on the offset region;
   wherein the insulating spacer in the offset region protects the bottom metal layer and insulator layer of the metal-insulator-metal structure against excessive etching.

12. A process for manufacturing a capacitor, comprising:
   forming an underlying support layer of an integrated circuit;

forming a metal-insulator-metal structure on top of the underlying support layer;

defining the metal-insulator-metal structure to form a capacitor wherein there is an offset region between a peripheral edge of a top metal layer and a bottom metal layer of the metal-insulator-metal structure; and forming an insulating spacer on the offset region;

wherein forming an insulating spacer on the offset region comprises depositing an insulator over and around the metal-insulator-metal structure and then anisotropically etching the deposited insulator to leave the insulating spacer on the offset region.

13. The process of claim 12 further comprising depositing a metal layer over and around the metal-insulator-metal structure with insulating spacer and then masking and etching the metal layer to form conductors co-planar with the metal-insulator-metal structure.

14. Process for manufacture of a MIM capacitor in an interconnection layer of an integrated circuit, comprising:

deposition of a first metallic layer on one of a lower interconnection dielectric layer or a substrate;

deposition of a first insulator layer on the first metallic layer;

deposition of a second metallic layer on the first insulator layer;

formation of an upper electrode of the MIM capacitor by removing part of the second metallic layer and expose a top surface of the first insulator layer;

deposition of a second insulator layer covering the upper electrode and top surface of the first insulator layer;

removing part of the second insulator layer to uncover the upper surface of the first insulator layer except at a corner location adjacent the upper electrode where second insulator layer material remains to form a corner spacer surrounding the upper electrode;

formation of a lower electrode and a dielectric of the MIM capacitor by removing part of the first metallic layer and that part of the first insulator layer not covered by the upper electrode and corner spacer;

deposition of a third insulating layer which covers the MIM capacitor and spacer.

* * * * *